(12) United States Patent
Zhang et al.

(10) Patent No.: US 7,353,010 B1
(45) Date of Patent: Apr. 1, 2008

(54) TECHNIQUES FOR FAST AUTOMATIC GAIN CONTROL

(75) Inventors: Ning Zhang, Milpitas, CA (US); William J. McFarland, Los Altos, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 513 days.

(21) Appl. No.: 11/021,291

(22) Filed: Dec. 22, 2004

(51) Int. Cl.
H04B 7/00 (2006.01)

(52) U.S. Cl. ............... 455/234.1; 455/232.1; 455/245.2; 455/251.1; 455/253.2; 330/254; 330/278

(58) Field of Classification Search ............. 455/234.1, 455/232.1, 239.1–250.1, 253.3, 127.2, 138, 455/136, 251.1, 424, 425, 456.5, 456.6, 575.1, 455/550.1, 561, 134, 63.1, 296; 330/279, 330/133, 149, 150, 245, 259, 278, 254; 375/317, 375/345, 346, 348, 350
See application file for complete search history.

(56) References Cited

U.S. PATENT DOCUMENTS

| | | | |
|---|---|---|---|
| 4,513,333 A | | 4/1985 | Young et al. |
| 5,258,758 A | * | 11/1993 | Sooch .................. 341/144 |
| 5,270,880 A | | 12/1993 | Ottesen et al. |
| 5,570,244 A | | 10/1996 | Wiselogel |
| 5,677,962 A | * | 10/1997 | Harrison et al. ............ 381/109 |
| 5,790,333 A | | 8/1998 | Kimura et al. |
| 5,995,305 A | | 11/1999 | McNeil et al. |
| 6,061,805 A | | 5/2000 | Suzuki et al. |
| 6,084,733 A | | 7/2000 | Ohzeki et al. |
| 6,101,053 A | | 8/2000 | Takahashi |
| 6,384,599 B1 | | 5/2002 | Chan et al. |
| 6,420,934 B1 | * | 7/2002 | Butler et al. ............... 330/279 |
| 6,438,184 B1 | * | 8/2002 | Nayler ....................... 375/345 |
| 6,469,855 B1 | | 10/2002 | Lamberts et al. |
| 6,476,992 B1 | | 11/2002 | Shimatani |
| 6,496,315 B1 | | 12/2002 | Ueda et al. |
| 6,625,433 B1 | * | 9/2003 | Poirier et al. ............ 455/232.1 |
| 6,657,804 B1 | | 12/2003 | Tomiyama et al. |
| 6,728,524 B2 | * | 4/2004 | Yamanaka et al. ....... 455/232.1 |

(Continued)

FOREIGN PATENT DOCUMENTS

JP 6084149 3/1994

(Continued)

*Primary Examiner*—Edward F. Urban
*Assistant Examiner*—Charles Chow
(74) *Attorney, Agent, or Firm*—Bever, Hoffman & Harms, LLP; Jeanette S. Harms (57) ABSTRACT

An automatic gain control (AGC) technique can quickly sense signal size over a large dynamic range by using a peak detector block in the analog portion of the receiver. The peak detector block can compare a received signal to predetermined thresholds (chosen to divide a potential signal range into smaller ranges). Therefore, the peak detector block can assist the automatic gain control (AGC) in quickly sizing the received signal. The AGC technique can also reduce digital filter settling time by simulating a gain change and providing this simulated value to the digital filters of the receiver. DC or spur components can be estimated prior to and after performing an analog gain change and then removed from digital signal samples. The digital signal samples sampled prior to performing the analog gain change can then be rescaled and provided to the digital filter, thereby avoiding discontinuity in a digital signal.

7 Claims, 6 Drawing Sheets

U.S. PATENT DOCUMENTS

| | | | |
|---|---|---|---|
| 6,804,501 B1* | 10/2004 | Bradley et al. | 455/138 |
| 6,836,647 B2* | 12/2004 | Rimini et al. | 455/226.2 |
| 6,927,628 B2* | 8/2005 | Oshima et al. | 330/133 |
| 7,013,117 B2* | 3/2006 | Darabi | 455/240.1 |
| 7,024,169 B2* | 4/2006 | Ciccarelli et al. | 455/232.1 |
| 7,085,334 B2* | 8/2006 | Burke et al. | 375/345 |
| 7,212,798 B1* | 5/2007 | Adams et al. | 455/251.1 |
| 7,218,258 B2* | 5/2007 | Delanghe et al. | 341/118 |
| 2002/0041208 A1* | 4/2002 | Hamada et al. | 330/149 |
| 2002/0160734 A1* | 10/2002 | Li et al. | 455/245.1 |
| 2003/0064696 A1* | 4/2003 | Akamine et al. | 455/311 |
| 2004/0081256 A1* | 4/2004 | Shi et al. | 375/317 |
| 2004/0090699 A1 | 5/2004 | Yang et al. | |
| 2004/0092238 A1* | 5/2004 | Filipovic | 455/131 |
| 2004/0125497 A1 | 7/2004 | Schmidt | |
| 2004/0242174 A1* | 12/2004 | Kim et al. | 455/136 |
| 2005/0075869 A1* | 4/2005 | Filipovic | 370/203 |
| 2005/0088215 A1* | 4/2005 | Suissa et al. | 327/307 |
| 2005/0136874 A1* | 6/2005 | Yeo et al. | 455/296 |
| 2005/0225388 A1* | 10/2005 | Ramachandran et al. | 330/150 |
| 2005/0250459 A1* | 11/2005 | Tervaluoto et al. | 455/127.2 |
| 2006/0223463 A1* | 10/2006 | Rahman et al. | 455/127.2 |

FOREIGN PATENT DOCUMENTS

| | | |
|---|---|---|
| JP | 2002032971 | 1/2002 |
| JP | 2002092803 | 3/2002 |

* cited by examiner

TECHNIQUES FOR FAST AUTOMATIC GAIN CONTROL

BACKGROUND OF THE INVENTION

1. Field of the Invention

The present invention relates to automatic gain control (AGC) and in particular to techniques used in digital AGC that can quickly sense the signal size over a large dynamic range and avoid digital filter settling time after gain change.

2. Description of the Related Art

Figure 1:
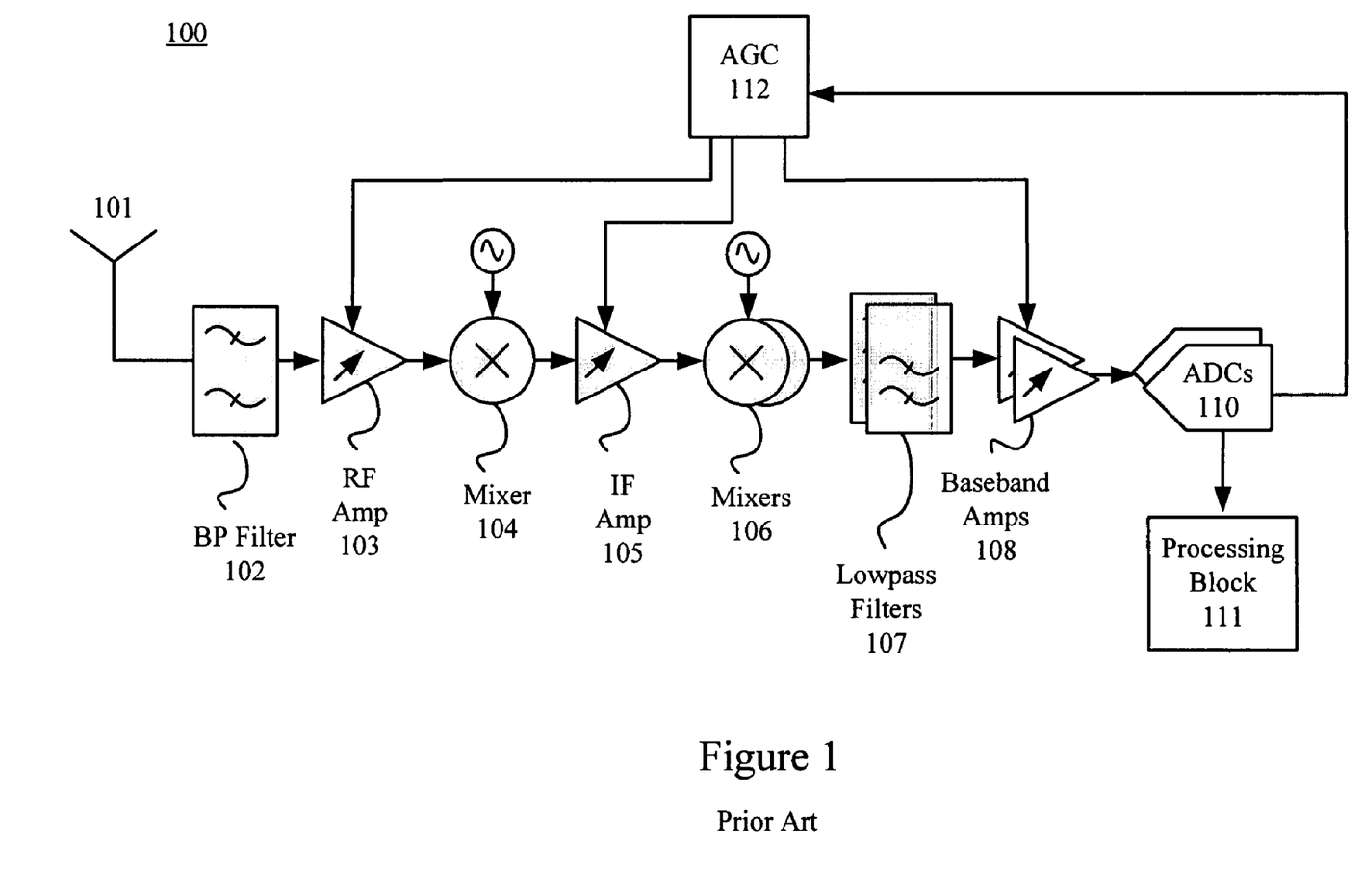
FIG. 1 illustrates a simplified receiver for receiving signals in a WLAN environment.

In a typical wireless communication system, a receiver has one or multiple variable gain stages before ADC. For example, FIG. 1 illustrates a simplified receiver 100 for receiving signals in a WLAN environment. In receiver 100, a bandpass filter 102 receives the incoming signals from an antenna 101 and outputs a predetermined band of frequencies (while excluding those frequencies higher and lower than the predetermined band). A variable gain RF amplifier 103 can provide an initial amplification to that predetermined band of frequencies. A mixer 104 converts those amplified signals (using a signal from a local oscillator) into intermediate frequency (IF) signals, which are then amplified by an IF amplifier 105.

In one embodiment, mixers 106 can include an in-phase mixer directly driven by a local oscillator and a quadrature mixer driven by the same local oscillator signal after it is phase-shifted by 90° in a phase shifter. In this way, in-phase (I) and quadrature (Q) components of the amplified IF signal are obtained at the outputs (only one shown) of mixers 106.

At this point, low-pass filters 107 (including both I and Q branches) can generate signals in the desired channel (called the baseband signals). Amplifiers 108 then amplify these baseband (BB) signals. Analog to digital converters (ADCs) 110 (provided for both the I and Q branches of low-pass filters 107) transform the amplified baseband signals into digital signals that can be analyzed by a processing block 111. ADCs 110 can be implemented as pipeline ADCs, sigma-delta converters, or any other mechanisms for converting analog signals to digital signals.

Amplifiers 103, 105, and 108 can advantageously amplify the received signal such that a weak signal can be distinguished from noise (i.e. provide a high signal to noise ratio (SNR)). However, too much amplification can adversely affect receiver 100. For example, an amplified strong signal can distort incoming signals, thereby overloading and possibly damaging certain components (e.g. saturating ADCs 110). For this reason, automatic gain control (AGC) 112 tries to maintain the amplified signals within certain ranges. Specifically, AGC 112 can use the magnitude of the digital signal, as detected by ADCs 110, to adjust the gains of amplifiers 103, 105, and 108. In a typical embodiment, AGC 112 uses the same gain adjustment value for RF amplifier 103, IF amplifier 105, and BB amplifiers 108.

Figure 2:
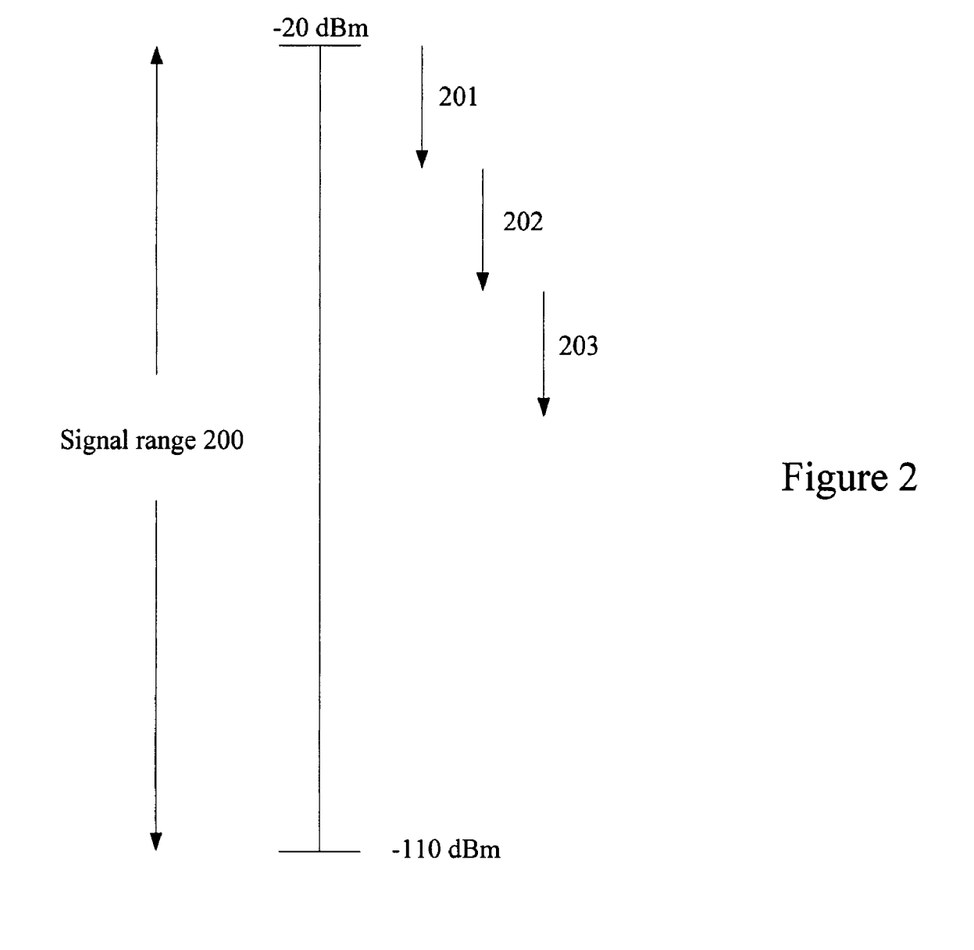
FIG. 2 illustrates a conventional correction technique when an ADC saturates.

Typically, a system initially uses a high gain when no signals are detected, thereby ensuring that any transmitted signals can be easily detected. However, if a large signal is then received, the ADCs can be saturated. For example, FIG. 2 illustrates an exemplary signal range 200 from −20 dB to −110 dB (i.e. a 90 dB range). If the gain of the amplifiers is set so as to permit detection of a signal at −110 dB, then a large signal could easily saturate the ADC. When the ADCs saturate, a conventional correction technique can consecutively drop the largest signal size by a first predetermined amount (e.g. 10 dB) until the ADCs do not saturate. FIG. 2 shows that three drops 201, 202, and 203 have been made.

This trial and error technique wastes significant time. Specifically, the gain of the amplifiers is ideally determined during the preamble of the packet, thereby allowing immediate decoding of the data (which follows the preamble). Unfortunately, this gain control technique can take longer than receipt of the preamble. In this case, the received data may be corrupted due to either ADC saturation or insufficient SNR.

Notably, AGC 112 can include narrow digital filters to filter out out-of-band interferences (called blockers) and noise. Narrow digital filters have a long settling time. Unfortunately, in, for example, a personal handy phone system (PHS), for each gain change made by AGC 112, digital signal processing must be delayed until these filters settle. Thus, yet more time is wasted due to digital filter settling.

Therefore, a need arises for a gain control technique that can quickly sense the signal size over a large dynamic range and minimize the digital filter settling time after a gain change. This improved gain control technique would be finished within the preamble and would also allow time for other tasks such as synchronization and impairment estimation.

SUMMARY OF THE INVENTION

In accordance with one aspect of the invention, a peak detector block can be used in the front-end analog portion of the receiver to provide a rough signal sizing assessment. In one embodiment, the peak detector block can compare a received signal to predetermined thresholds. These thresholds can be chosen to divide the whole possible signal range into smaller ranges. Therefore, the peak detector block can assist the automatic gain control (AGC) in quickly sizing the received signal.

In accordance with another aspect of the invention, the settling time for a digital filter in the receiver can be dramatically reduced. For this reduction, a non-linearly scaling component of the received signal (e.g. the DC or spur component) can be estimated prior to and after performing an analog gain change. This non-linearly scaling component can then be removed from a digital signal associated with the received signal. At this point, the digital signal can be rescaled prior to performing the analog gain change. This rescaled signal can then be provided to the digital filter. In other words, the gain change to be done on the front end (e.g. to a variable gain amplifier) can be simulated in the digital domain, thereby eliminating the significant (and undesirable) transition between the digital signal before gain change and the associated digital signal after gain change.

In accordance with yet another aspect of the invention, a system for providing quick automatic gain control in a receiver is provided. This system can include a variable gain amplifier for receiving an analog signal. The peak detector block can detect an amplitude of that analog signal. A set of mixers can convert an amplified output of the variable gain amplifier into in-phase (I) and quadrature (Q) components generating. A set of filters can receive the I and Q components and then generate a baseband signal. At this point, an analog to digital converter (ADC) can convert the baseband signal to a digital signal. Advantageously, an automatic gain control (AGC) can receive an output of the peak detector block and provide a control signal to the variable gain amplifier.

In one embodiment, the peak detection block can include a peak detector and a comparator. The peak detector can be coupled to a terminal of the variable gain amplifier. The comparator can compare an output of that peak detector and a replica threshold signal. Based on its comparison, the comparator can output a range signal to the AGC. In one embodiment, if the peak detector output does exceed a threshold, then the peak detection block can output a "1" (meaning that a very large signal is being received and hard saturation of the ADCs is occurring). On the other hand, if the peak detector output does not exceed the threshold, then the peak detection block can output a "0" (meaning moderate saturation of the ADCs is occurring).

The peak detection block can further include a digital to analog converter (DAC) for receiving a digital threshold signal and generating an analog threshold signal. A replica peak detector can receive the analog threshold signal and generate the replica threshold signal.

In one embodiment, the system can include multiple variable gain amplifiers and multiple peak detectors in the peak detector block, wherein each peak detector can be connected to a terminal of at least one variable gain amplifier. In this embodiment, a selection device, e.g. a multiplexer, can programmably select which of the multiple peak detectors to connect to the comparator.

DETAILED DESCRIPTION OF THE FIGURES

An automatic gain control (AGC) technique can quickly sense signal size over a large dynamic range by using peak detectors in the analog portion of the receiver. This AGC technique can also save digital filter settling time by simulating a gain change and providing this simulated value to the digital filters of the receiver. This AGC technique and its advantages will now be described in further detail.

Peak Detectors Allow Quick Gain Adjustment

In accordance with one aspect of the invention, a peak detector block can be used in the front-end analog portion of the receiver to provide a rough signal sizing assessment. This peak detector block can compare the received signal to predetermined thresholds. These thresholds can be chosen to divide a possible signal range into smaller ranges. These smaller ranges permit effective selection of gain settings to bring the ADC out of saturation.

Figure 3:
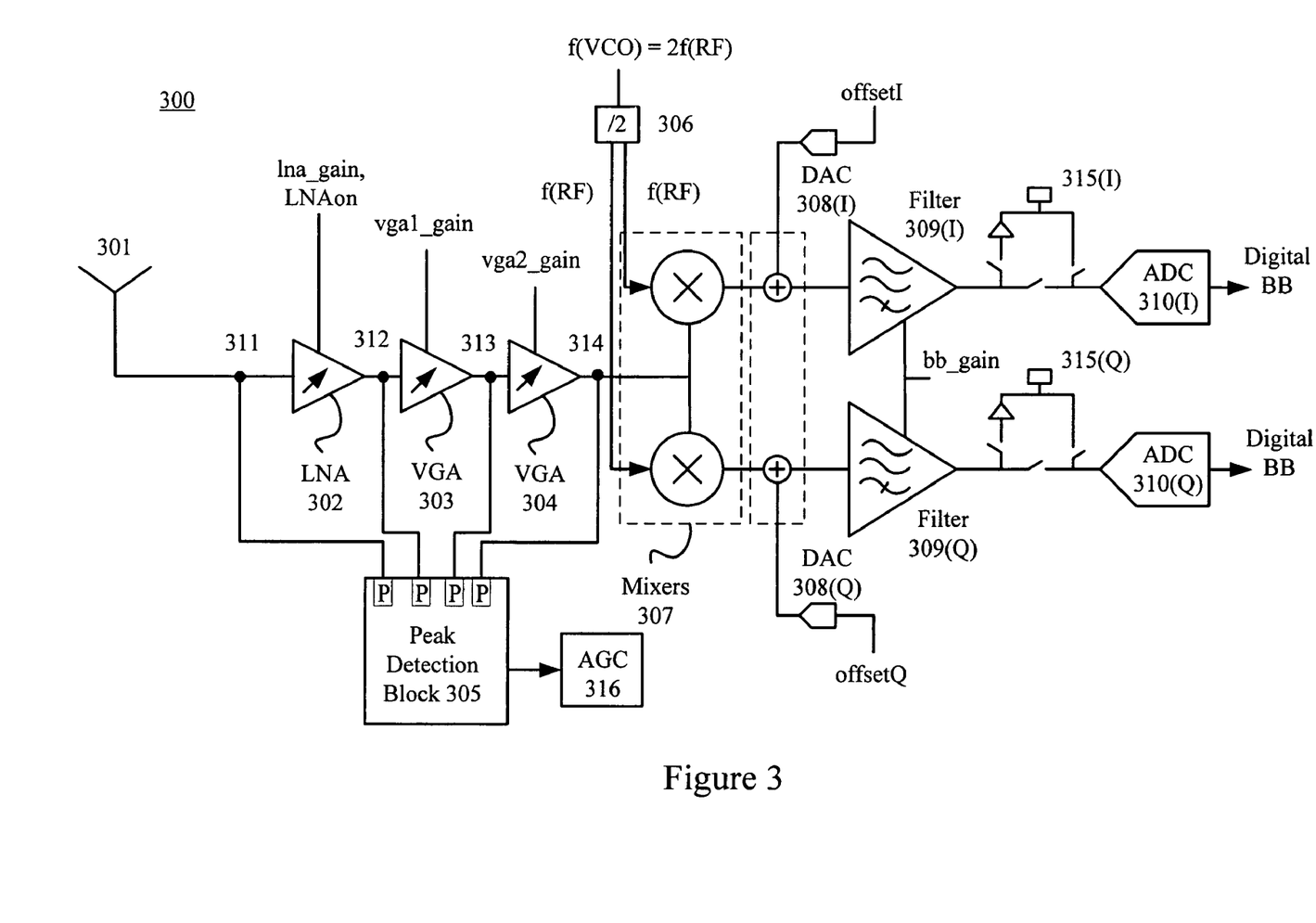
FIG. 3 illustrates a receiver that can advantageously include peak detectors.

FIG. 3 illustrates a receiver 300 that can advantageously include peak detectors. In receiver 300, a low noise amplifier (LNA) 302 can receive the incoming signals from an antenna 301 and provide an initial amplification to those signals. Two variable gain amplifiers (VGA) 303 and 304 successively amplify the output of LNA 302. (Note that LNA 302 is also a variable gain amplifier although designated differently.) Mixers 307 convert the amplified output of VGA 304 into in-phase (I) and quadrature (Q) components. In this embodiment, the quadrature LOs for mixers 307 can be generated by a local divide-by-2 block 306.

At this point, filters 309(I) and 309(Q) (including both I and Q branches) can generate signals in the desired channel (called the analog baseband signals) and amplify those baseband signals. Note that filters 309(I) and 309(Q) function substantially as combined low-pass filters 107 and amplifiers 108 in FIG. 1. In one embodiment of receiver 300, the output of filters 309(I) and 309(Q) can be diverted to test pads 315(I) and 315(Q) using appropriate drivers and switches (or, alternatively, off-chip signals could be applied to ADCs 310(I)/310(Q) using test pads 315(I) and 315(Q) and appropriate switches). Analog to digital converters (ADCs) 310(I) and 310(Q) (provided for both the I and Q branches of filters 309(I) and 309(Q)) transform the amplified analog baseband signals into digital baseband signals that can be analyzed by a processing block (e.g. processing block 111 in FIG. 1).

In accordance with one aspect of the invention, a peak detection block 305 can be used to detect the amplitude of the analog signal, as measured at one of nodes 311, 312, 313, and 314, and provides its output to an automatic gain control (AGC) 316. In another embodiment, node 311 may be the only source for peak detection block 305. In one embodiment, peak detection block 305 can be programmed (e.g. by a user or system software) to sample the analog signal at a particular node.

In one embodiment, peak detection block 305 can include peak detectors (i.e. any type of amplitude measuring devices) (indicated by a "P") for each of nodes 311-314. Peak detection block 305 can compare the sampled analog signal to a plurality of thresholds. If the signal at a node does exceed a threshold, then peak detection block 305 can output a "1" (meaning that a very large signal is being received and hard saturation of the ADCs is occurring). On the other hand, if the signal at a node does not exceed the threshold, then peak detection block 305 can output a "0" (meaning moderate saturation of the ADCs is occurring).

Figure 4:
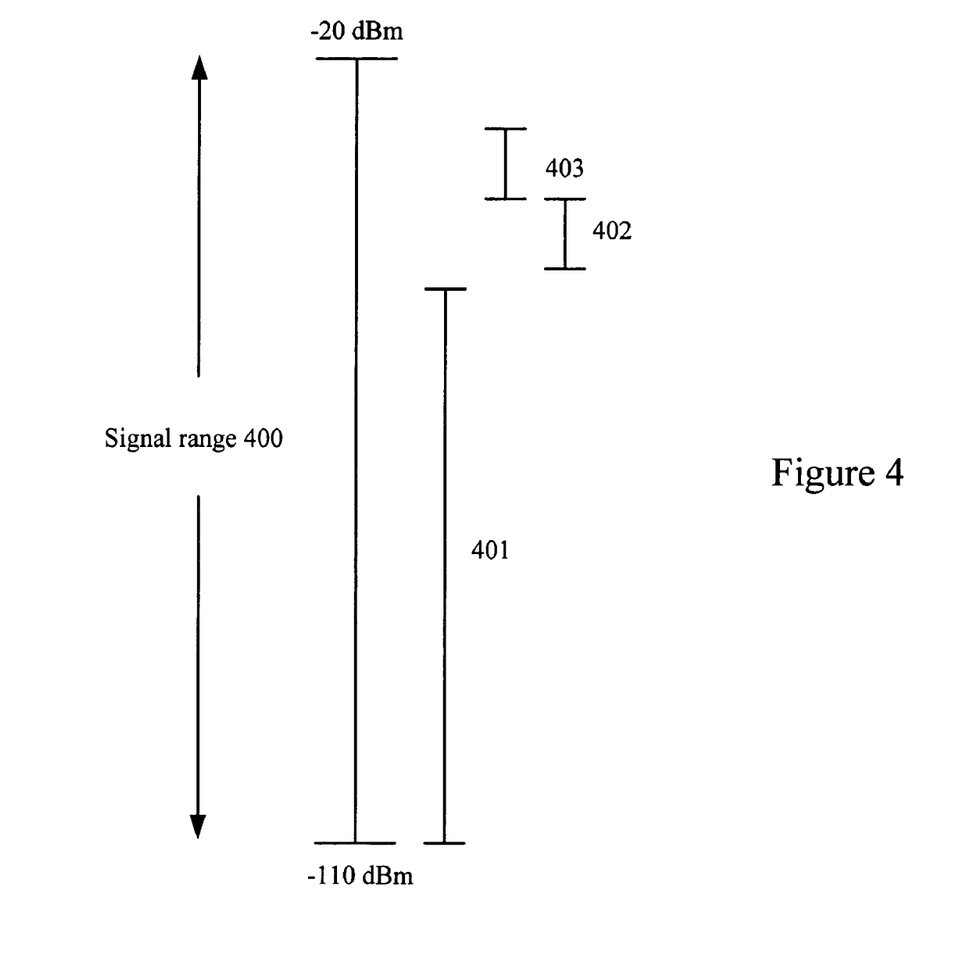
FIG. 4 illustrates a threshold technique for quickly correcting ADC saturation.

AGC 316 can use the detected threshold level to adjust the gains of LNA 302 (lna_gain), VGA 303 (vga1_gain), VGA 304 (vga2_gain), and filters 304(I)/304(Q) (bb_gain). In one embodiment, the thresholds can be chosen to divide the whole possible signal range into smaller ranges. For example, FIG. 4 illustrates a possible signal range 400 from −20 dB to −110 dB. A first range 401 from −50 dB to −110 dB is an area in which the ADCs will not saturate. Remaining ranges that will saturate the ADCs could include a second range 402 from −40 dB to −50 dB and a third range 403 from −30 dB to −40 dB. In one embodiment, the threshold associated with each range can be the largest dB for that range (e.g. the threshold for range 402 could be −40 dB). In one embodiment, three ranges may be used wherein two ranges in which the ADC may saturate are created. A signal level in the first such range may be indicated by noting ADC saturation and a "0" output of peak detection block 305 and the second such range indicated by noting ADC saturation and a "1" output of peak detection block 305.

In one embodiment, once a threshold is exceeded, the AGC can advantageously adjust the gain such that saturation of the ADCs may be avoided. For example, if the threshold for range 402 is exceeded, but the threshold for range 403 is not exceeded, then the signal is somewhere within range 403. In this case, if the signal could be reduced by 20 dB, then the ADCs would be guaranteed to be delivered a signal in range 401, which would not saturate the ADCs. Note that using this threshold technique advantageously provides a quick automatic gain correction, thereby significantly improving on the inefficient trial and error technique previously used.

In one embodiment, LNA 302 (FIG. 3) can be implemented in a fully differential cascaded architecture to provide immunity to on-chip common mode supply noise from the digital section of receiver 300. The inductively degenerated differential pair results in complex input impedance, wherein the resistive part can be matched to the source impedance using an off-chip matching network. In one embodiment, LNA 302 can have three gain settings: high (LNAon="1", lna_gain="1"), low (LNAon="1", lna_gain="0"), and off (LNAon="0"). In the low gain setting, 75% of the bias current can be diverted from the output load to vdd, thereby resulting in a 4-to-1 reduction in output signal amplitude. In the off gain setting (used when very strong signals are detected), LNA 302 can be turned off by grounding its cascode transistors, and transmission is through the parasitic capacitances coupling input to output. In one embodiment, the high, low, and off gain stages of LNA 302 are associated with gains (in dB) of 26.8, 16.1, and −13.3, respectively.

In one embodiment, VGA 303 can be implemented as a variable gain differential amplifier inductively tuned to 1.9 GHz. Three ~10 dB gain steps can be provided, thereby resulting in four gain stages (e.g. −11.6, 0, 11.1, and 24.0 (in dB)). For the two lower gain settings, linearity can be determined by the input devices. Specifically, linearity can be increased by increasing the Vdsat of the input devices (e.g. by increasing the length and increasing the current density to get the desired gain). In contrast, for the two higher gain settings, linearity can be determined by the output clipping range.

In one embodiment, VGA 304 can be implemented as a variable gain differential amplifier that is not inductively tuned. Specifically, VGA 304 can include a two-stage amplifier in which the first stage load is an RC network that mimics a very low-Q inductor. VGA 304 can have four gain settings separated by ~5 dB steps, e.g. 4.8, 9.6, 12.3, and 17.0. Note that a dedicated regulator can provide the voltage supply for LNA 302 and VGA 303, thereby minimizing the potential of clock noise coupling to the input of LNA 302 through the supply lines.

In one embodiment, mixers 307 can be implemented as passive mixers, wherein the DC current is zero and the 1/f noise is substantially zero. Because passive mixers have a net loss instead of gain, VGA 304 is advantageously placed in front of mixers 307. In this configuration, the gain of VGA 304 can compensate for the loss of mixers 307. In one embodiment, mixers 307 can have a fixed gain of −4.5 dB.

A passive mixer typically includes four switches connected in a standard bridge-like configuration. The headroom requirements of the baseband circuitry mandate that the output of mixers 307 be biased at or near mid-rail. Neither NMOS nor PMOS transistors are considered good switches for voltages near mid-rail. Therefore, in one embodiment, native (non-minimum length) devices can be used.

The I/Q LO required for mixers 307 can be generated locally by divider 306. The outputs of divider 306 can be provided to a LO driver that is capable of driving mixers 307 with high amount of voltage swing (e.g. at least 1 volt peak to peak single-ended over all corners). In passive mixers, if the DC level is not set properly, the mixers can either expand or compress the signal. To eliminate this expansion/compression, the gates of the native devices can be biased such that the devices are at the verge of tuning on when the LO signals are balanced. To set the DC bias of the LO signals, a common mode feedback can be used in the LO drivers. In this configuration, the switches can be biased such that neither make-before-break nor break-before-make scenarios are exercised. In other words, the switches can be advantageously biased at the threshold voltage. In one embodiment, a replica bias circuit can create this voltage and the common mode feedback can enforce that voltage.

In one embodiment, filters 309(I)/309(Q) can have thirteen gain settings (in dB): 12-24 (in 1 dB increments).

Figure 5:
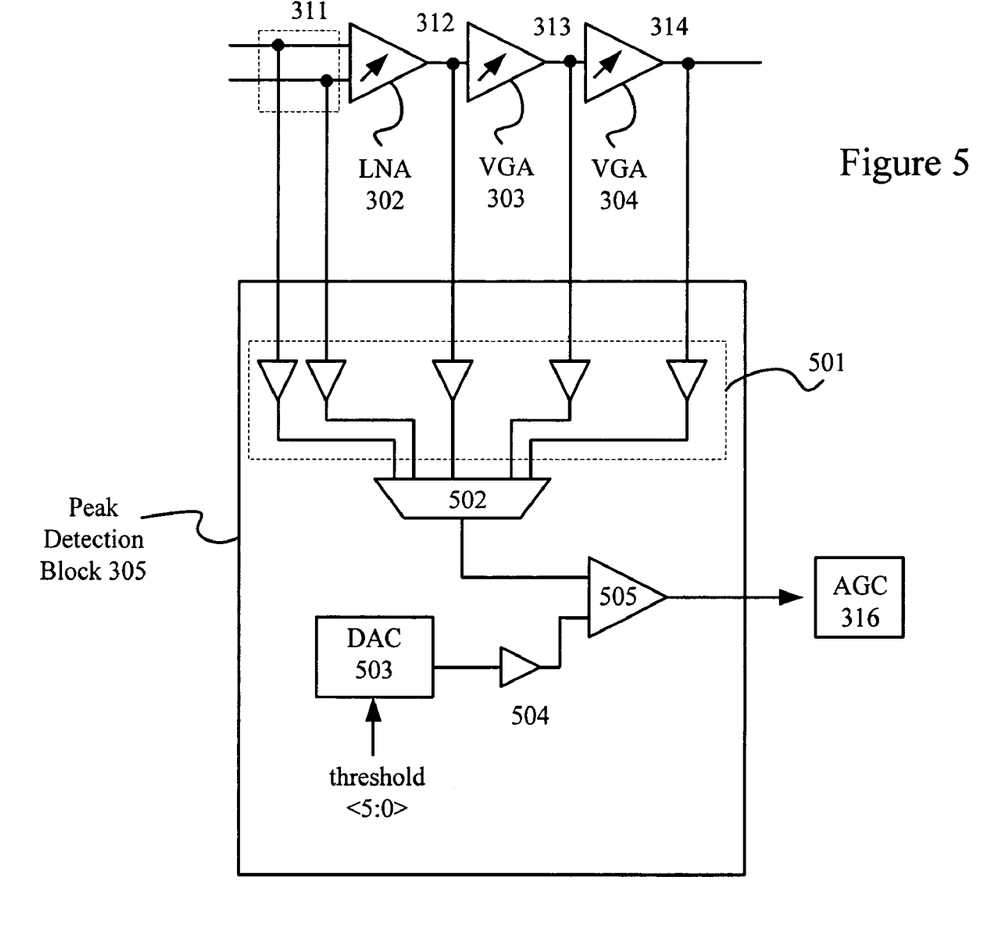
FIG. 5 illustrates an exemplary peak detection block.

FIG. 5 illustrates an exemplary peak detection block 305. Some components of the receiver shown in FIG. 3, i.e. LNA 302, VGA 303, VGA 304, nodes 311/312/313/314, and AGC 316, are shown for context. In this embodiment, peak detection block 305 can include five peak detectors 501. Two detectors can monitor the two inputs of LNA 302 (node 311), one detector can monitor the differential output of LNA 302 (node 312), another detector can monitor the differential output of VGA 303 (node 313), and yet another detector can monitor the differential output of VGA 304 (node 314). That is, when LNA 302, VGA 303, and VGA 304 are implemented as differential devices, a peak detector may include two detectors connected to the inn and inp (or negative/positive) inputs, wherein the peak detector can measure the peak voltage swing of whichever input is the largest. In one embodiment, a peak detector can include a diode, wherein the diode can demonstrate an enhanced sensitivity near the threshold.

In peak detection block 305, a switch 502 (e.g. a multiplexer) can select one of the peak detectors 501 to provide an output to a comparator 505. In one embodiment, the peak detector connected to node 312 can be selected. In another embodiment, the peak detector connected to node 313 can be selected. A comparator 505 can compare the peak voltage at the selected node to a threshold value (associated with digital threshold <5:0>) and can generate an asynchronous digital output (i.e. the above-mentioned "0" or "1" indicating saturation).

In this embodiment, threshold <5:0> and can be converted to an analog signal using a DAC (digital to analog converter) 503. DAC 503 provides the resulting signal to a replica peak detector 504, which in turn provides its output to comparator 505. In this configuration, replica peak detector 504 ensures that comparator 505 can accurately compare the peak voltage at the selected node to a predetermined threshold.

In one embodiment, a calibration of peak detectors 501 can be performed during manufacturing to correct for DC offset (DC offset does not vary with temperature). Note that the DC offset determined for one peak detector can be inferred for the other peak detectors (assuming that the peak detectors are similar and physically located in substantially the same area of the integrated circuit). Notably, a predetermined default threshold, e.g. 16, can provide adequate margin even if the measured offset turns out to be larger than +8 LSB (described in further detail below).

In one embodiment, to perform this calibration, LNA 302 is powered down so that no signal can reach the peak detector of interest. At this point, a binary search on thresh<5:0> can be done to find a value that corresponds to the zero crossing of comparator 505. This value, the calibrated zero crossing point, can be identical to the default threshold (for an offset-free chip) or lower/higher than the default threshold (for a real chip). The desired digital amplitude can be determined using bench test results.

DAC 503 can be programmed to use the sum of the calibrated zero crossing point and the desired digital amplitude. For example, DAC 503 can be set such that if threshold <5:0> is set to 16 (decimal), then the output of replica peak detector 504 is identical to the output of switch 502, i.e. comparator 505 would read its inputs as identical. If threshold <5:0> is set to a bigger number, e.g. 19, then the signal level has to be 0.120 V (differential amplitude) to trip comparator 505. In other words, the one bit output of comparator 505 (i.e. the "1" or "0") can indicate if the node signal is above the threshold <5:0> or below it.

A threshold <5:0> set to 19 is only 3 LSB (least significant bit) above 16 (the default threshold). The number 3 can thus be characterized as the desired digital amplitude. Note that the smaller the desired digital amplitude the more sensitive the peak detector. Table 1 shows exemplary peak detector characteristics.

TABLE 1

Peak Characteristics

| threshold <5:0> | Amplitude (V) |
| --- | --- |
| 16 + 2 | 0.093 |
| 16 + 3 | 0.120 |
| 16 + 4 | 0.144 |
| 16 + 5 | 0.165 |
| 16 + 6 | 0.185 |
| 16 + 7 | 0.204 |
| 16 + 8 | 0.222 |
| 16 + 9 | 0.241 |
| 16 + 10 | 0.259 |
| 16 + 11 | 0.276 |
| 16 + 12 | 0.292 |
| 16 + 13 | 0.310 |
| 16 + 14 | 0.325 |
| 16 + 15 | 0.339 |
| 16 + 16 | 0.354 |
| 16 + 17 | 0.372 |
| 16 + 18 | 0.388 |
| 16 + 19 | 0.403 |
| 16 + 20 | 0.419 |
| 16 + 21 | 0.433 |
| 16 + 22 | 0.448 |
| 16 + 23 | 0.462 |
| 16 + 24 | 0.478 |
| 16 + 25 | 0.493 |
| 16 + 26 | 0.509 |
| 16 + 27 | 0.522 |
| 16 + 28 | 0.538 |
| 16 + 29 | 0.554 |
| 16 + 30 | 0.567 |
| 16 + 31 | 0.583 |
| 16 + 32 | 0.599 |
| 16 + 33 | 0.612 |
| 16 + 34 | 0.628 |
| 16 + 35 | 0.642 |
| 16 + 36 | 0.657 |
| 16 + 37 | 0.673 |
| 16 + 38 | 0.687 |
| 16 + 39 | 0.702 |
| 16 + 40 | 0.716 |
| 16 + 41 | 0.731 |
| 16 + 42 | 0.745 |
| 16 + 43 | 0.761 |
| 16 + 44 | 0.774 |
| 16 + 45 | 0.788 |
| 16 + 46 | 0.804 |
| 16 + 47 | 0.817 |

Rescaling Before Gain Change

In accordance with another aspect of the invention, to save the settling time in a digital filter, the signal provided to the digital filter can be rescaled. Rescaling can advantageously avoid the discontinuity in the signal before being passed to the digital filters. Notably, this techniques works only when the digital signal scales with the analog gain.

If DC offset and/or spur is present in a receiver, the received signal can be expressed as:

$$\vec{y} = A\vec{x} + B + Ce^{jw_{spur}t},$$

where $\vec{x}$ is the received signal at the antenna, A is the gain magnitude and phase, B is the DC offset magnitude and phase, C is the spur magnitude and phase, and $w_{spur}$ is the receiver spur frequency that is known.

Because both the DC and spur components (or other types of non-linearly scaling components) can be due to leakage and coupling of various analog blocks, these components are not linearly scaled by the receiver gain, i.e. the magnitude and phase of these components can change significantly, although not directly scaled by gain adjustment. Therefore, referring to FIG. 6, to remove the discontinuity of non-linearly scaling components, these components can be estimated both before and after the gain change in step 601. At this point, the non-linearly scaling components can be removed from the digital signal samples in step 602.

Figure 6:
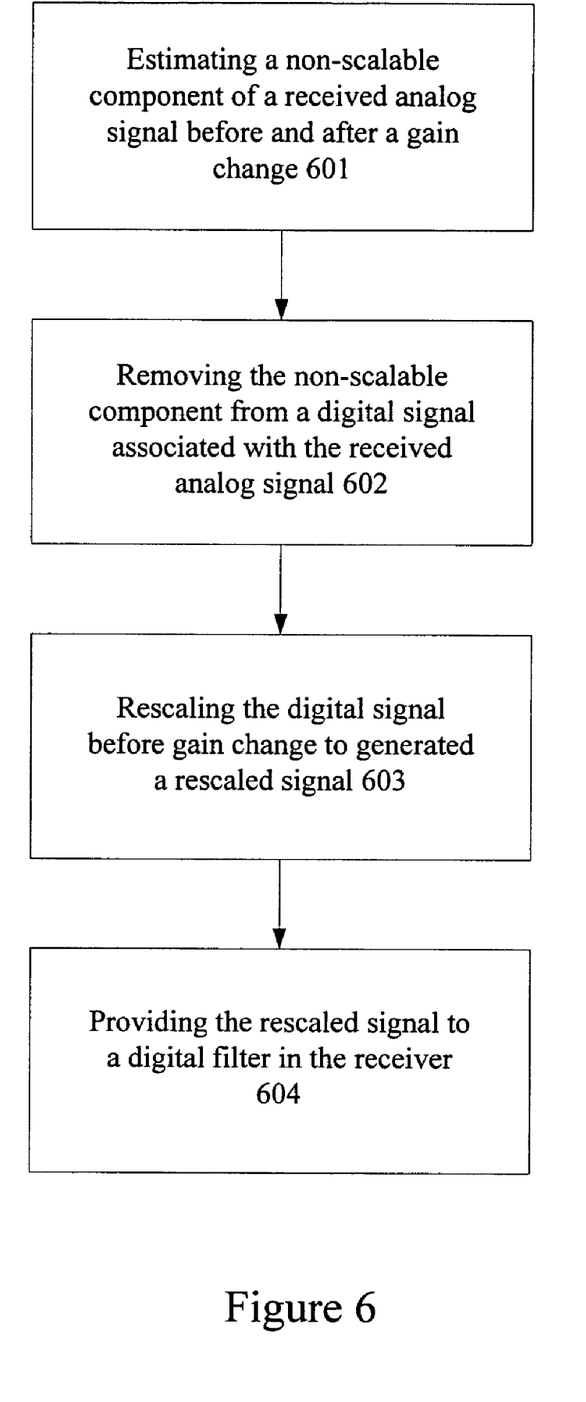
FIG. 6 illustrates a method of saving the settling time in a digital filter.

After these components are removed, the digital signal samples sampled before the gain change can be rescaled in step 603 to generate a rescaled signal. This rescaled signal can then be sent to the digital filters in step 604. In other words, the gain change to be done on the front end (i.e. to LNA 302, VGAs 303/304, and filters 309(I)/309(Q)) can be simulated in the digital domain, thereby eliminating the significant (and undesirable) transition between the digital signal before gain change and the associated digital signal after gain change.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A method of providing quick signal sizing for a receiver in a wireless communication system, the method comprising:
   sampling a received signal at various amplification stages in an analog section of the receiver, wherein at least one sampling location occurs before the amplification stages, between amplification stages, and after the amplification stages;
   determining a peak voltage at each of the sampling locations;
   selecting the peak voltage at a sampling location;
   comparing the peak voltage at the selected sampling location to predetermined thresholds, the predetermined thresholds dividing a potential range into smaller ranges;
   determining a signal range based on the comparing; and
   determining a gain change based on the range.

2. The method of claim 1, wherein determining the peak voltage includes:
   detecting the received signal using a peak detector.

3. The method of claim 2, wherein comparing the peak voltage at the selected sampling location to predetermined thresholds further includes:
   generating a replica signal using a replica peak detector, the replica signal associated with a threshold; and
   comparing the replica signal and the peak voltage.

4. The method of claim 3, wherein the threshold is a digital threshold, and wherein generating the replica signal includes:
  converting the digital threshold to an associated analog threshold.

5. A system for providing quick automatic gain control in a receiver, the receiver operable in a wireless communication system, the system comprising:
  a plurality of variable gain amplifiers (VGAs) for amplifying an analog signal;
  a peak detector block including:
    a plurality of peak detectors, wherein at least one peak detector is connected to one node before the VGAs, another node between the VGAs, and yet another node after the VGAs, each peak detector for detecting an amplitude of the analog signal;
    a comparator having first and second input terminals, the first input terminal for receiving a programmable threshold value;
    a switch for selectively connecting one peak detector to the second input terminal of the comparator;
  a mixer set for converting an amplified output of a last VGA of the plurality of VGAs into in-phase (I) and quadrature (Q) components;
  a filter set for receiving the I and Q components and generating a baseband signal;
  an analog to digital converter (ADC) for converting the baseband signal to a digital signal; and
  an automatic gain control (AGC) for receiving an output of the comparator of the peak detector block and providing a control signals to the plurality of VGAs.

6. The system of claim 5, wherein the comparator compares an output of the selected peak detector and a replica threshold signal, and outputs a range signal to the AGC.

7. The system of claim 6, wherein the peak detection block further includes:
  a digital to analog converter (DAC) for receiving a digital threshold signal and generating an analog threshold signal; and
  a replica peak detector for receiving the analog threshold signal and generating the replica threshold signal.

* * * * *